`United States Patent` [19]

Amingual et al.

[11] Patent Number: 4,791,467
[45] Date of Patent: Dec. 13, 1988

[54] HETEROJUNCTION HGCDTE PHOTOVOLTAIC DETECTOR AND ITS PRODUCTION PROCESS

[75] Inventors: Daniel Amingual; Pierre Felix, both of Grenoble, France

[73] Assignee: Commissariat A L'Energie Atomique, Paris, France

[21] Appl. No.: 943,557

[22] Filed: Dec. 18, 1986

[30] Foreign Application Priority Data

Jan. 8, 1986 [FR] France .................................. 86 00172

[51] Int. Cl.$^4$ ...................... H01L 27/14; H01L 31/00; H01L 29/161; H01L 29/205
[52] U.S. Cl. ......................................... 357/30; 357/16; 357/24; 357/55; 357/61
[58] Field of Search ................ 357/30 B, 30 D, 30 Q, 357/30 R, 61, 55, 16, 24 LR, 30 E, 30 F, 30 G, 30 I

[56] References Cited

U.S. PATENT DOCUMENTS

| | | | |
|---|---|---|---|
| 3,988,774 | 10/1976 | Cohen-Solal et al. | 357/30 B |
| 4,206,003 | 6/1980 | Koehler | 357/30 B |
| 4,507,674 | 3/1985 | Gaalema | 357/30 Q |

FOREIGN PATENT DOCUMENTS

| | | |
|---|---|---|
| 0060743 | 9/1982 | European Pat. Off. ............... 357/30 |
| 0064918 | 11/1982 | European Pat. Off. . |
| 0090669 | 10/1983 | European Pat. Off. . |
| 2535899 | 5/1984 | France . |
| 59-189685 | 10/1984 | Japan ....................................... 357/30 |
| 60-148177 | 8/1985 | Japan ....................................... 357/30 |
| 2029639 | 3/1980 | United Kingdom . |

OTHER PUBLICATIONS

Journal of Applied Physics, vol. 57, No. 8, Apr. 1985, "Hg$_{1-x}$Cd$_x$Te-Hg$_{1-y}$Cd$_y$Te(O$\leq$x,y$\leq$1) Heterostructures: Properties Epitaxy, and Applications", Herman et al.

Conference Europeene Sur Les Communications Optiques, 21-24, Sep. 1982.

Primary Examiner—J. Carroll
Assistant Examiner—Ngan Van Ngo
Attorney, Agent, or Firm—Pearne, Gordon, McCoy & Granger

[57] ABSTRACT

Heterojunction HgCdTe detector has in order, a first type P Hg$_{1-x1}$Cd$_{xi}$Te monocrystalline semiconductor layer, $x_1$ being a number between 0 and 1, containing a first type P region, a second type P Hg$_{1-x2}$Cd$_{x2}$Te monocrystalline semiconductor layer, $x_2$ being a number higher than $x_1$ between 0 and 1, containing a second type N region which faces and is in contact with the first region, an electrical insulant located above the first semiconductor layer and an electric contact element located on the insulant for collecting the electric signal produced in said first region, said contact element having a part traversing the second region and partly penetrating the first region with application to infrared radiation detection.

11 Claims, 4 Drawing Sheets

HETEROJUNCTION HGCDTE PHOTOVOLTAIC DETECTOR AND ITS PRODUCTION PROCESS

BACKGROUND OF THE INVENTION

The present invention relates to a planar structure HgCdTe photovoltaic detector and to its production process. This detector, whose semiconductor material HgCdTe has a small forbidden band width is particularly suitable for detection of infrared radiation.

The semiconductor compound is in fact a solid solution of mercury telluride (HgTe) and cadmium telluride (CdTe) of formula $Hg_{1-x}Cd_xTe$. The parameter x between 0 and 1, commonly called the composition, fixes the cadmium telluride: mercury telluride ratio. It also fixes the forbidden band width Eg of the compound and this in turn fixes the spectral detection range of the radiation. A forbidden band width Eg makes it possible to detect photons of wavelength below the cut-off wavelenth $\mu_c$ of the detector with $\lambda_c = 1.24/Eg$ ($\lambda_c$ is expressed in $\mu m$ and Eg in eV).

Composition x can be continuously adjusted, thus making it possible to cover a vast spectral range from $\lambda_c = 0.8 \ \mu m$ (x=1) to very great wavelengths (Eg=0 for $x \approx 0.17$), detections up to a wavelength of 30 $\mu m$ having been demonstrated.

Usually greatest interest is attached to spectral ranges adapted to atmospheric transmission windows, e.g. windows of wavelengths 3 to 5 $\mu m$ and 8 to 12 $\mu m$. These transmission windows are in fact well adapted to thermal imaging, because at temperature close to ambient temperature (290° K.) objects have an inherent emission maximum at a wavelength of about 10 $\mu m$. Compositions x close to 0.30 and 0.20 respectively correspond to the spectral ranges of 3 to 5 and 8 to 12 $\mu m$.

The compound HgCdTe has been universally adopted for producing detectors equipping high performance infrared systems. These detectors are either of the photoconductive type, or of the photovoltaic type. The present invention relates to devices of the second type.

HgCdTe would also appear to be the most promising for producing mosaics of integrated electronic raading detectors for equipping future infrared systems. Thus, it makes it possible to produce high quality photovoltaic detectors permitting an optimum coupling to the reading circuit with a very low dissipation.

Brief reference will now be made to the various performance criteria to be respected by a photovoltaic detector. The most important parameters, which appear in the attached FIG. 1, showing the characteristic I=f(V) of such a detector are:

a short-circuit current or photocurrent $I_c$, which is a function of the incident photon flux, a dark current $I_0$ corresponding to the reverse bias of the detector, which must be small compared with the photocurrent $I_c$, a zero bias dynamic resistance $R_o$, which must be high, a shunt resistance $R_s$ corresponding to a dynamic resistance when the detector is reverse biased and which must be high for an optimum coupling to the electronic reading circuit and for minimizing the noise of the reverse biased detector and a high avalanche voltage $V_A$.

All these performances naturally impose an upper limit to the use temperature, which becomes smaller as the forbidden band length Eg decreases and the cut-off wavelength $\lambda_c$ is high. In particular, $R_o$ varies as exp($-Eg/kT$) or exp($-Eg/2 \ kT$) in accordance with the use temperature range, k being the Boltzmann constant and T the temperature in °Kelvin.

However, towards low temperatures, there is a ceiling to performances as a result of the appearance of currents which are independent of the temperature and which are often linked with leakage current phenomena on the surface of the detector. The origin of these leakage currents can be an interband tunnel effect, which increases very rapidly with the cut-off wavelength. High performances may be sought towards low temperature, particularly under ambient conditions with a limited photon flux, e.g. in infrared astronomy.

Initially, using planar technology, the photovoltaic detectors were produced in the form of a single PN junction in the HgCdTe semiconductor material. The attached FIG. 2 shows a planar structure HgCdTe detector. This detector comprises on a monocrystalline CdTe substrate 1 a monocrystalline layer 3 of $Hg_{1-x}Cd_xTe$ of type P with 0<x<1 having a diffused type N region 5 constituting the active zone of the detector. The semiconductor layer 3 is surmounted by an insulating coating 7, e.g. of ZnS having a window 9 permitting electric contacting on the type N region 5. Contacting is ensured by a contact element 11, e.g. of chromium-gold. Such a detector is more particularly described in "Semiconductors and Semimetals" vol. 18, Mercury Cadmium Telluride Chapter 6, pp.201 . . . Academic Press, 1981.

Unfortunately, these simple planar structure detectors had excessive dark currents $I_0$ and consequently inadequate dynamic resistances $R_o$, which limited their spectral range and consequently their use.

In order to improve the performances of HgCdTe photovoltaic detectors, consideration was given to producing them in the form of heterojunctions with the PN junction with a small forbidden band width and a PN junction with a greater forbidden band width. In the article by P. MIGLIORATO and A. M. WHITE, which appeared in Solid State Electronics, vol. 26, no.1,pp.65 to 69, 1983 and entitled "Common anion heterojunctions: CdTe-CdHgTe", a description is given of N cDTe/P $Hg_{1-x}Cd_xTe$ heterojunctions with 0<x<1 and more generally heterojunctions N $Hg_{1-x1}Cd_{x1}Te/P \ Hg_{1-x2}Cd_{x2}Te$ respectively with the forbidden band width $Eg_1$ and $Eg_2$, $Eg_1$ being smaller than $Eg_2$ and in which $x_1$ is smaller than $x_2$.

This type of heterojunction can be schematically represented as in FIG. 3. It comprises a monocrystalline type P $Hg_{1-x1}Cd_{x1}Te$ monocrystalline layer 13 surmounted by another type p $Hg_{1-x2}Cd_{x2}Te$ monocrystalline layer 15 having a type N implanted or diffused region 17.

In such a heterostructure, the connection of the energy bands follows the common anion law, which essentially fixes the valence band. This valence band has no gap at the heterojunction, the gap $Eg_2 - Eg_1$ being transferred to the conduction band. Moreover, the heterojunction is abrupt, i.e. one passes abruptly from composition $x_2$ to composition $X_1$.

In view of the discontinuity of the conduction band, photons of a great wavelength cannot be detected. Thus, energy photons between $Eg_2$ and $Eg_1$ can only be absorbed in the material of composition $x_1$. Electrons produced during an irradiation of the structure cannot traverse the heterojunction because they encounter a potential barrier.

MIGLIORATO and WHITE proposed surmounting this problem by a gradual heterojunction making it possible to eliminate the potential barrier opposing the passage of the heterojunction by electrons. The potential barrier disappears for a gradual N doping which is sufficiently high in the part of composition $x_2$ and sufficiently gradual variations at the heterojunction of said doping and of the composition.

The attached FIG. 4 shows on the one hand the variations of the N doping ($D_N$) as a function of the depth Z (FIG. 3) of the semiconductor material and on the other hand the variations of the composition x of said material as a function of Z.

Although apparently very attractive, such a solution causes numerous production difficulties, because all the parameters have to be precisely adjusted. Thus, the following conditions have to be fulfilled:

the electric junction (passage from type N material to type P material) and the metallurgical junction (maximum variation of compositions x) must coincide;

the doping $D_N$ of zone N of composition $x_2$ must be sufficiently high; and the variation of composition x must not be too gradual compared with the variation of the doping $D_N$.

It is merely necessary for one of these conditions not to be fulfilled for there to be a potential barrier which opposes the passage of electrons through the heterojunction. These electrons are produced as a result of an irradiation in the semiconductor of composition of $x_1$ with a small forbidden band width $Eg_1$.

Details of other known HgCdTe detectors using a continuous variation of composition x in accordance with the thickness of the semiconductor layer in the article by E. IGRAS and J. PIOTROWSKI "A new CdHgTe Photodiode Type with Protected Junction Surface" which was published in Optica Applicata VI, 3, pp.99-103, 1976. In these detectors, the maximum value of x occurs on the interface with the insulant. However, in the case of contacting on HgCdTe of type N with a large forbidden band width, the same sensitivity loss at high wavelengths persists.

SUMMARY OF THE INVENTION

The present invention specifically relates to a HgCdTe photovoltaic detector with a planar structure and heterojunction having improved performance characteristics compared with the aforementioned detectors. Moreover, it can be produced by a simple production process not involving critical stages. Therefore the present invention specifically relates to a photovoltaic detector with a planar structure having a first $Hg_{1-x_1}Cd_{x_1}Te$ monocrystalline semiconductor layer with a first conductivity type, $x_1$ being a number between 0 and 1, said first semiconductor layer containing a first region of a second conductivity type, an electrical insulant located above the first semiconductor layer and an electric contact element located on the insulant serving to collect the electric signal produced in said first region, wherein a second $Hg_{1-x_2}Cd_{x_2}Te$ monocrystalline semiconductor layer of the first conductivity type is interposed between the first semiconductor layer and the insulant, $x_2$ being a number exceeding $x_1$, between 0 and 1, said second semiconductor layer containing a second region of the second conductivity type facing and in contact with said first region and wherein the contact element comprises a part traversing said second region and partly penetrating said first region.

The detector according to the invention has the following advantages compared with the prior art detectors:

an uncritical technological construction, particularly with respect to the composition and doping profiles;

improved performance characteristics towards high operating temperatures as a result of a reduction of the dark currents dependent on the temperature;

improved performance characteristics at low temperature and with weak photon fluxes, due to the reduction of the dark currents and in particular surface leakage currents, independent of the temperature.

The composition profile between the semiconductors of compositions $x_1$ and $x_2$ is not critical and can be abrupt or gradual (with a variation on the thickness of approximately 1 micron). Thus, as the electric conductor passes up to the semiconductor with a small forbidden band width, i.e. of composition $x_1$, the electrons produced in said semiconductor during an illumination of the detector could pass freely into an external circuit without any obstacle constituted by the aforementioned potential barrier.

Preferably, the first and second semiconductor layers have a type P conductivity and the first and second regions a type N conductivity. Advantageously, the first region has a thickness between 0.5 and 5 $\mu$m.

The photovoltaic detector according to the invention can be used by illuminating it by the front face, i.e. from the side of the insulant, or by illuminating it by the rear face, i.e. from the side opposite to the insulant. In the first use mode, the sensitive zone of the detector, i.e. the regions of the second conductivity type N for example, must only be partly covered by the metallization.

Advantageously, the detector according to the invention comprises means for processing the signal produced in said first region.

The invention also relates to a process for producing a photovoltaic detector with a planar structure and heterojunction.

According to the invention, this process comprises the following stages:

(a) deposition on a first $Hg_{1-x_1}Cd_{x_1}Te$ monocrystalline semiconductor layer of a first conductivity type, $x_1$ being a number between 0 and 1, of a second $Hg_{1-x_2}Cd_{x_2}Te$ monocrystalline semiconductor layer of the first conductivity type, $x_2$ being a number greater than $x_1$ and between 0 and 1, (b) deposition of a first electric insulant layer on the second semiconductor layer, (c) opening a window in the first insulant layer with a view to realizing the sensitive zone, (d) doping through the first insulant layer first and second semiconductor layers for forming two superimposed regions of a second conductivity type constituting said sensitive zone, a first region in the first semiconductor layer and a second region in the second semiconductor layer, (e) formation of an electric contact hole at the location of the active zone completely traversing the second semiconductor layer and in part the first semiconductor layer, (f) metallization of the electric contact hole.

This process is simple to perform and has no critical stages.

According to a preferred way of performing the process according to the invention, stage (d) is performed after stage (e), the window of the first insulant layer also serving to produce the contact hole. This makes it possible to form a first region, particularly of type N with a reduced perimeter.

Advantageously, prior to stage (f), there is an overdoping of the second conductivity type in the bottom of the contact hole.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 5:
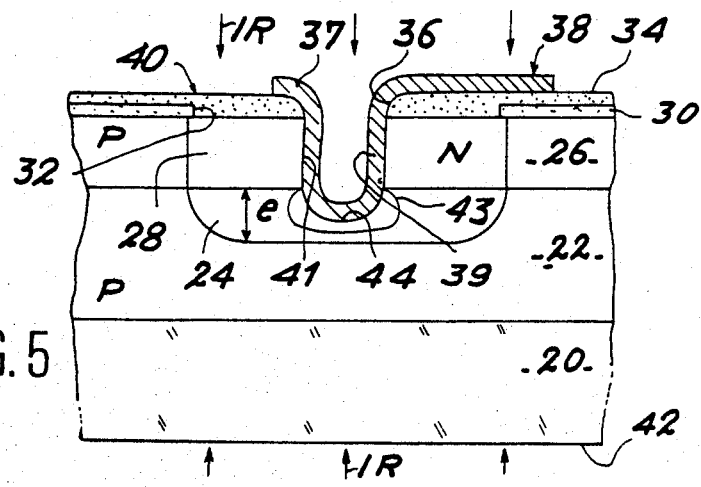
FIG. 5: Diagrammatically a photovoltaic detector according to the invention with a "front face, rear face" illumination.

FIG. 5 shows a first embodiment of a photovoltaic detector with a planar structure according to the invention.

This detector comprises a monocrystalline substrate 20, which is transparent to the radiation to be detected. In the particular case of detecting infrared radiation, the substrate is e.g. made from sapphire or cadmium telluride. Substrate 20 is covered with a first $Hg_{1-x_1}Cd_{x_1}Te$ monocrystalline semiconductor layer 22 with $0 < x_1 < 1$. In particular, $x_1$ can be such that $0.2 \leq x_1 < 0.3$ and is e.g. equal to 0.2. The value of $x_1$ fixes the central wavelength of the light radiation detectable by the detector. This semiconductor layer 22 has a type P conductivity and its thickness can vary between 5 and 15 μm. Layer 22 contains a type N, diffused or implanted region 24 essentially constituting the active zone of the photovoltaic detector. Region 24 has a thickness e between 0.5 and 5 μm.

Figure 1:
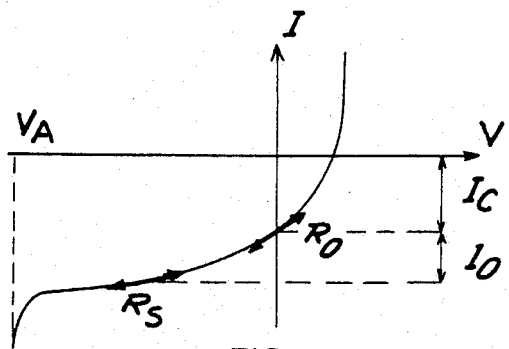
FIG. 1: Already described, a curve giving the variations of current I as a function of the voltage V applied to the terminals of a HgCdTe photovoltaic detector, said curve serving to illustrate the different parameters having to be satisfied by such a detector.
Figure 2:
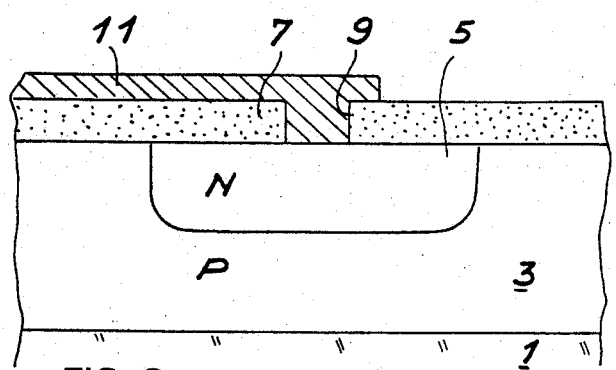
FIG. 2: Already described, diagrammatically a HgCdTe photovoltaic detector of the planar structure, monojunction type, illustrating the state of the art.
Figure 3:
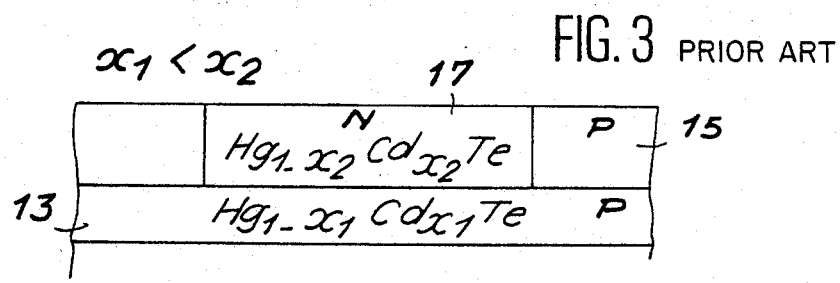
FIG. 3: Already described, a diagrammatic view of a HgCdTe heterojunction illustrating the state of the art.
Figure 4:
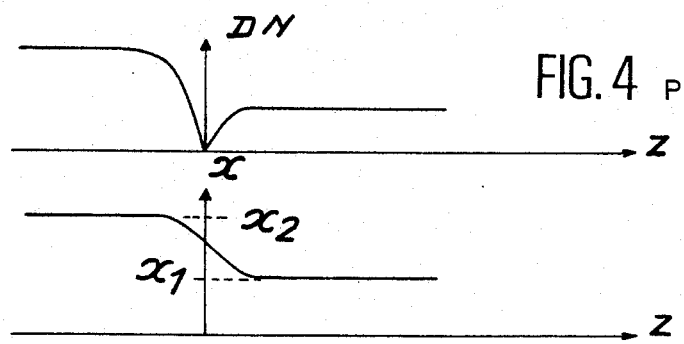
FIG. 4: Already described, on the one hand the variations of the N doping ($D_N$) as a function of the depth (Z) of a heterostruture semiconductor material and on the other hand the variations of the composition x of said material as a function of the depth Z.

Semiconductor layer 22 is covered by a $Hg_{1-x_2}Cd_{x_2}Te$ monocrystalline semiconductor layer 26 with $0 < x_2 < 1$. Composition $x_2$ is greater than composition $x_1$ and can be such that $0.3 \leq x_2 \leq 0.8$. The value of $x_2$ is dependent on the envisaged application. Simply for the purposes of a good characteristic I=f(v) (FIG. 1) of the detector, $x_2$ can be equal to 0.3 or 0.4. For a detector equipped with an electronic circuit for processing the signal produced in the active zone, $x_2$ can be 0.7 and even up to 0.8. Said semiconductor layer 26 has a type P conductivity and its thickness can be between 0.5 and 5 μm. Semiconductor layer 26 contains a type N, diffused or implanted region 28. This type N region 28 also forms part of the sensitive zone of the photovoltaic detector. The two type N regions 24 and 28 are superimposed and contiguous.

The second semiconductor layer 26 is covered by a first insulant layer 30, e.g. of zinc sulphide or silicon oxide (SiO or $SiO_2$). This insulant layer 30 is provided with an opening 32 with the same dimensions as the type N regions of the detector. This first insulant 32 is covered by a second insulant 34 of the same nature as the first insulant 30. These two insulant layers 30 and 34 have a thickness of approximately 0.5 μm.

The second insulant 34 is provided with an opening 36 permitting electric contacting in the active zone of the detector i.e. in the type N regions. Contacting is ensured by an electric contact element 38 located in an electric contact hole 41 formed in the sensitive zone of the detector. This contact element 38 is formed from a part 37 located below the second insulant 34 and a part 39 completely traversing the type N region 28 and partly traversing the type N region 24. This contact element 38 can be in the form of two superimposed layers, namely a chromium layer of approximately 25 nm and a gold layer of approximately 1 μm.

The detector shown in FIG. 5 can be illuminated either by the front face 40, i.e. the side of the insulant 34, or from the rear face 42, i.e. the free side of substrate 20. In order that the active zone or regions N of the detector can detect radiation, symbolized by the arrows, by its front face 40, part 37 on the surface of contact element 38 must not completely cover said active zone (left-hand part of FIG. 5).

In this embodiment, the detector according to the invention advantageously has no substrate 20. In this case, the semiconductor layer 22 has a thickness extending exceeding 15 μm and is e.g. 500 μm. Moreover, the semiconductor layers 22 and 26 can have a type N conductivity, so that the diffused or implanted regions forming the sensitive zone of the detector are then of type P.

Figure 6:
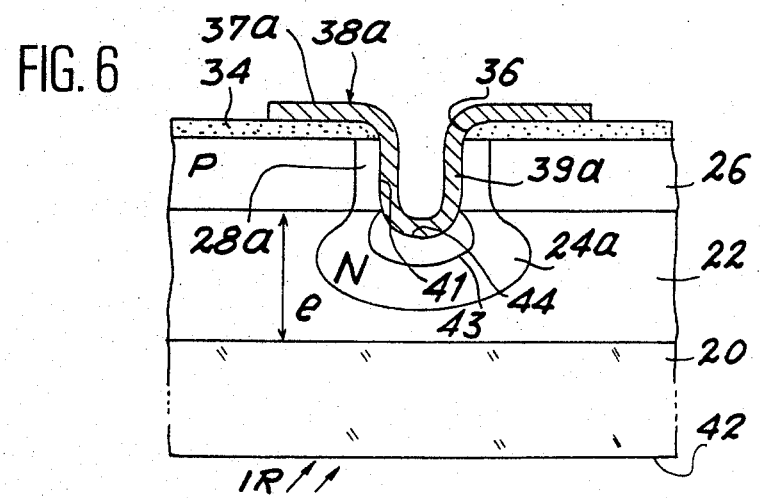
FIG. 6: Diagrammatically a photovoltaic detector according to the invention with "rear face" illumination.

FIG. 6 shows a second embodiment of a planar structure photovoltaic detector according to the invention. The parts of said detector identical in all points to those of the detector shown in FIG. 5 carry the same references. The structural parts which are different, but which fulfil the same function carry the same references followed by an a.

The detector shown in FIG. 6 comprises, as hereinbefore, a monocrystalline substrate 20, which is transparent to the radiation to be detected and which is covered by a first type P $Hg_{1-x_1}Cd_{x_1}Te$ monocrystalline semiconductor layer 22 with $0 < x_1 < 1$, containing a type N diffused or implanted region 24a. The latter has a thickness between 0.5 and 5 μm. The semiconductor layer 22 is covered by a second type P $Hg_{1-x_2}Cd_{x_2}Te$ monocrystalline semiconductor layer 26 with $0 < x_1 < x_2 < 1$. This semiconductor layer 26 contains a type N region 28a located above and in contact with the type N region 24a located in the first semiconductor layer 22.

The second semiconductor layer 26 is covered by an insulating layer 34 having an opening 36 permitting electric contacting in the active zone of the detector.

Electric contacting is ensured by a contact element 38a having a part 37a located above insulant 34 and a part 39a completely traversing the type N region 28a and partly traversing the type N regigon 24a.

The detector of FIG. 6, which has a simpler structure than that of the detector of FIG. 5 and which in particular only has a single insulant layer is intended for use solely with the illumination of the detector by the rear face 42 (free side of the substrate). Under these conditions, part 37a of the contact element 38a surmounting insulant 34 can completely cover the sensitive zone or type N regions of the detector. In this embodiment, the perimeter of the type N region 28a is reduced compared with that of the detector of FIG. 5. Moreover, the shape of the type N region 24a of said detector differs from that shown in FIG. 5.

As hereinbefore, it is optionally possible to eliminate substrate 20. In this case, bearing in mind that lighting or illumination is solely by the rear face, the semiconductor layer must have a relatively small thickness of approximately 10 $\mu$m.

The structural differences between the detector of FIG. 5 and that of FIG. 6 are linked with the slightly different production process thereof, specifically with regards to the formation of the type N regions of these detectors, as will be shown hereinafter.

The photovoltaic detectors according to the invention and shown in FIGS. 5 and 6 have improved performance characteristics, both at high and low operating temperatures in the case of a weak photon flux, due to a significant reduction of the dark current sources. These dark currents are exponentially dependent on the forbidden band width of the semiconductor materials, are in particular reduced through the use of two different semiconductor layers of composition x, the layer with the weakest composition $x_1$ being contiguous to the substrate and the layer with the strongest composition $x_2$ contiguous to the insulant 34.

Moreover, by using a thickness e of the type N region 24 or 24a of the material of composition $x_1$ below the diffusion length of the holes in said material and e.g. between 0.5 and 5 $\mu$m as a function of the value of $x_1$, it is possible to further decrease the dark current sources.

Finally, in order to further reduce the dark current sources, it is possible to have a N+ overdoping in the immediate vicinity of the electric contact element, i.e. portion 43 in the bottom 44 (FIGS. 5 and 6) of electric contact hole 41. In particular, the concentration of type N doping ions of the semiconductor layers 24 and 28 can be between $10^{15}$ and $10^{17}$ at/cm$^3$ and the concentration of these same ions in the bottom 44 of contact hole 41 can exceed $10^{18}$ at/cm$^3$.

Figure 7:
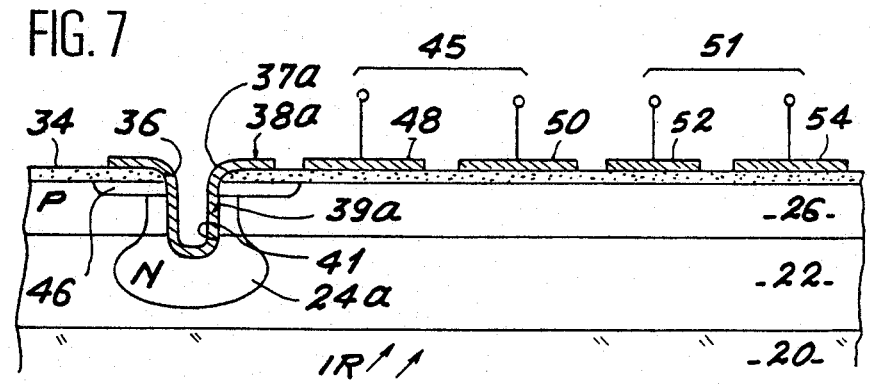
FIG. 7: Diagrammatically a photovoltaic detector according to the invention equipped with a system for processing the incorporated signal produced in the active zone of the detector.

FIG. 7 shows a photovoltaic detector according to the invention provided with a system for processing the incorporated signal. The detector is of the illumination by the rear face type and can detect infrared radiation of 10 $\mu$m. As hereinbefore, it comprises a type P $Hg_{1-x_1}Cd_{x_1}Te$ semiconductor layer 22 with $0 < x_1 < 1$ and in particular of $Hg_{0.8}Cd_{0.2}Te$ containing a diffused or implanted N region 24a and a second $Hg_{1-x_2}Cd_{x_2}Te$ semiconductor layer with $0 < x_1 < x_2 < 1$ and e.g. $0.2 < x_2 < 1$.

Composition $x_2$ is chosen solely as a function of purely electrical requirements, such as e.g. the greatest possible width of the forbidden band $Eg_2$, in order to make the production of the processing circuits as uncritical as possible. Thus, the semiconductor layer 26 is reserved for the processing of the signal produced in the active zone of the detector and has a thickness between 0.5 and 5 $\mu$m.

The photovoltaic detector also comprises an insulant 34 (e.g. ZnS) provided with an opening 36 for contacting in the sensitive zone of the detector (N regions). Contacting is ensured by an electric contact element 38a located in a contact hole 41. As hereinbefore, this contact element 38a comprises a part 39a traversing the semiconductor layer 26 and partly penetrating the semiconductor layer 22.

The processing of the signal mainly produced in the type N region 24a of composition $x_1$ can be detected by a NMOS transistor 45 coupled to a charge transfer device 51 of the IRCCD type produced in the layer 26 of composition $x_2$. An example of a system for processing the incorporated signal with a photovoltaic detector has in particular been described in the article by KOCH and PHILLIPS - SBRC - published in proceedings of the 1984 IEDM Conference, San Francisco and entitled "Monolithic Intrinsic NMOS HgCdTe IRCCD's with on chip signal processing".

The NMOS transistor 45 comprises a type N source 46 obtained by the diffusion of mercury or the implantation of ions in the semiconductor layer 26 of composition $x_2$, a gate electrode 48 located on insulant 34 and a drain induced in layer 26 having a drain electrode 50 also located on the insulant and parallel to the gate electrode 48. Gate electrode 48 and drain electrode 50 can e.g. be made from chromium-gold.

The charge transfer device 51 comprises a transfer gate used for the transfer of charges into layer 26 and having a gate electrode 52 and a multiplexing electrode 54 for the transferred charges. The gate electrode 52 and multiplexing electrode 54 are both located on insulant 34.

Coupling between detection zone 24a of the detector and the source of the NMOS transistor for processing circuit input is performed directly by that part 37a of the electric contact element 38a located below the source 46 of the transistor and the type N region 24a.

A description will now be given of the production processes for the two embodiments of the photovoltaic detector according to the invention described hereinbefore.

FIGS. 8 to 15 show the different stages in the production of the detector shown in FIG. 5.

Figure 8:
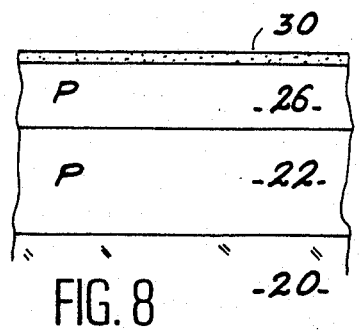
FIGS. 8 to 15: Different stages in the production of the photovoltaic detector of FIG. 5.

The first stage of this process comprises, as shown in FIG. 8, depositing on a monocrystalline substrate 20, which is transparent to the radiation to be detected and e.g. of sapphire or CdTe for infrared detection, a first monocrystalline semiconductor layer 22. This $Hg_{1-x_1}Cd_{x_1}Te$ layer 22 with $x_1$ between 0 and 1 and e.g. equal to 0.2 can be formed by epitaxy from substrate 20. The epitaxy methods which can be used and which are well known in the art are liquid phase epitaxy, molecular jet epitaxy and epitaxy by cathodic sputtering in mercury plasma or from organometallic cadmium and tellurium compounds. This type P semiconductor layer 22 e.g. has a thickness between 5 and 15 $\mu$m.

If substrate 20 is eliminated, semiconductor layer 22 is produced in solid form by Bridgman growth, solid phase crystallization or Traveller Heating Method (THM).

On the semiconductor layer 22 are deposited by epitaxy from said layer, a second type P $Hg_{1-x_2}Cd_{x_2}Te$ monocrystalline semiconductor layer 26, $x_2$ being a number exceeding $x_1$ and between 0 and 1, e.g. being equal to 0.4. The epitaxy method usable for forming this layer 26 can be one of those referred to hereinbefore. This semiconductor layer 26 has a thickness between 0.5 and 5 µm.

The second semiconductor layer 26 is then covered with a first insulating layer 30 having a thickness of about 0.5 µm. This insulating layer, which is e.g. of zinc sulphide or silicon oxide, can be deposited by a chemical vapour phase deposition process.

Figure 9:
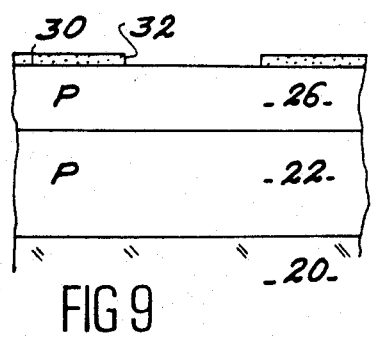

The following stage of the process consists and as shown in FIG. 9 opening within the insulating layer 30 a hole 32, whose dimensions define those of the sensitive zone of the detector to be produced. Window 32 e.g. has a diameter of 20 µm. Window 32 can be opened by using a resin mask, obtained by conventional photolithography processes and by eliminating, e.g. by chemical etching the unmasked insulant region. The etching agent can e.g. be hydrochloric acid in the case of a zinc sulphide layer 32.

Figure 10:
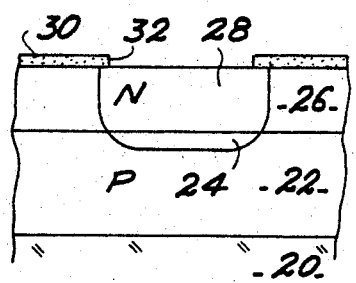

As shown in FIG. 10, the following stage of the process consists of diffusing or implanting ions in the semiconductor layers 26 and 22 using the etched insulant layer 30 as the diffusion or implantation mask.

This sensitive zone is formed from two type N regions 24, 28 of respective composition $x_1$ and $x_2$. The type N region 28 has a thickness equal to that of the semiconductor layer 26 in which it is formed and the type N region 24 has a thickness below that of layer 22 in which it is formed. For example, region 24 has a thickness between 0.5 and 5 µm. The total thickness of the sensitive zone of the detector is determined, in the case of a diffusion of ions, by the temperature and duration of said diffusion, and in the case of ion implantation by the implantation does and energy.

Figure 11:
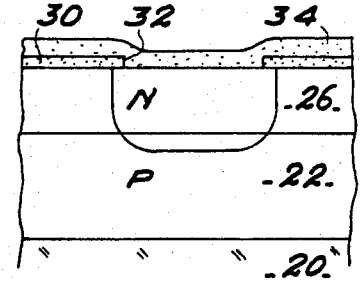

As shown in FIG. 11, the following stage of the process consists of covering the complete structure with a second insulating layer 34, which is 0.5 µm. This insulating layer, which is e.g. of zinc sulphide or silicon oxide, can be deposited by a chemical vapour phase deposition process.

Figure 12:
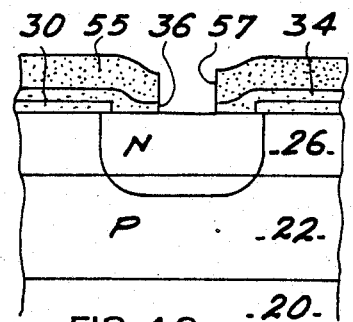

Using conventional photolithography processes and as shown in FIG. 12, a positive resin mask 55 is then produced on insulating layer 34, provided with an opening 57. The resin used is a phenol formaldehyde resin, such as resin AZ 1350 marketed by Shippley.

Opening 57, which is positioned just above the sensitive zone (N regions) of the detector e.g. has a diameter of 5 µm and makes it possible to define the dimensions of the electric contact hole to be produced.

An opening 36 is then made in insulating layer 34 by eliminating the insulant region not covered with resin. This elimination can be performed by chemical etching or ionic working. In the case of a zinc sulphide insulant layer 34, chemical etching can be carried out with hydrochloric acid as the etching agent.

Figure 13:
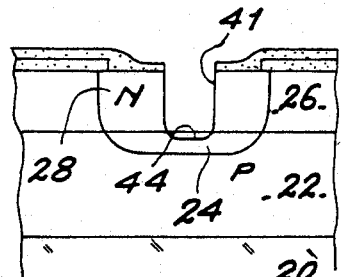

As shown in FIG. 13, over the entire thickness of the type N region 28 elimination takes place of the area of said region 28 not masked by insulant 34 and resin 55 and for a given thickness, which is less than that of the type N region 24. Elimination takes place of the area of said region 24 not masked by the insulant and the resin, in order to form the electric contact hole 41 of the detector.

The diameter of the contact hole 41 formed is equal to that of the window 57 of the resin mask 55 and is e.g. equal to 5 µm and the depth of said hole is e.g. 5 µm. The opening of contact hole 41 can be effected by ionic working, which also makes it possible to partly eliminate the resin mask 55. Thus, the resin mask must have a significant thickness, greater than 2 µm, in order that it can serve as a screen despite the working thereof with abrasive ions, such as argon ions. The working rate of the HgCdTe semi/conductor material is approximately 150 nm/min and the etching rate of the resin mask 55 to 30 nm/min. Etching by ionic working makes it possible to produce relatively deep contact holes (5 µm). In the case when it is wished to etch shallower holes, the less accurate chemical etching process could be used.

Figure 14:
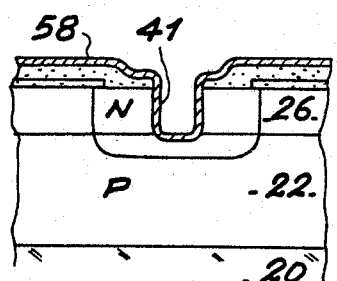

After cleaning residues by a chemical method, as shown in FIG. 14, metallization of the structure takes place, more particularly by cathodic sputtering. This metallization 58 can be formed by two stacked layers, namely a chromium layer and then a gold layer having respective thicknesses 25 nm and 1 µm. Deposition by cathodic sputtering makes it possible to obtain a two-layer metallization 58 of uniform thickness covering the bottom and sides of the contact hole 41.

Figure 15:
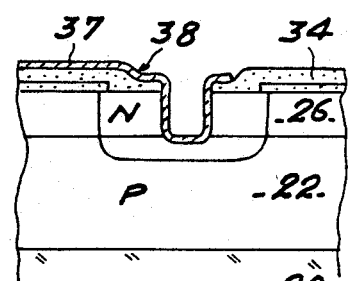

As shown in FIG. 15, the following stage of the process consists of etching the two-layer metallization 58 to give the final shape to the electric contact element 38. This etching can be carried out by ionic working or chemical etching through a resin mask and carried out in accordance with conventional photolithography processes. In the case of chemical etching with a chromium - gold metallization, use is made of potassium iodide for gold etching and an aqueous $NaOH + K_3FeCN_6$ aqueous solution for chromium etching. The part 37 of the electric element covering insulant 34 makes it possible to connect the photovoltaic detector obtained to an electrical processing circuit, which can in particular be that shown in FIG. 7.

In this particular case of a monolithic structure with an incorporated processing system, the gate electrode 48 and drain electrode 50 of NMOS transistor 45 on the one hand and the transfer electrode 52 and multiplexing electrode 54 of the charge transfer device on the other can be formed by the metallization 58 during its etching for producing the electric contact element 38.

In order to increase the performance characteristics of the photovoltaic detector increased by reducing the dark current sources, following the formation of the electric contact hole 41 (FIG. 13), it is possible to carry out type N+ overdoping of the bottom 44 thereof. This overdoping can be carried out by implantation of boron ions with a dose of $5 \times 10^{14}$ at/cm$^3$ and an energy of 100 keV.

A description will now be given of the process for the production of the photovoltaic detector according to the invention in the case of illumination from the rear face and as shown in FIG. 6.

Figure 16:
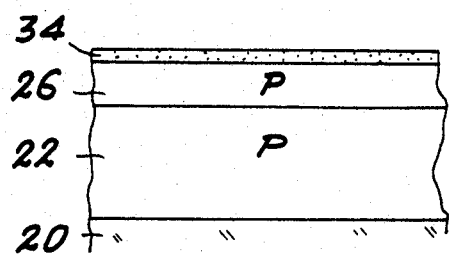
FIGS. 16 to 20 The different stages in the production of the photovoltaic detector of FIG. 6.

As shown in FIG. 16, as hereinbefore, successive depositions take place by epitaxy of two type P semiconductor layers 22, 26 on an e.g. cadmium telluride monocrystalline substrate 20. Layer 22 is of $Hg_{1-x_1}Cd_{x_1}Te$ and layer 26 of $Hg_{1-x_2}Cd_{x_2}Te$ with $0 < x_1 < x_2 < 1$. In the optional case of eliminating substrate 20, semiconductor layer 22 can be obtained by crystal growth, according to the CPS or Bridgman method, followed by reducing the thickness to approximately 10 µm in order to permit illumination of the detector by its rear face. This is followed by the direct deposition on semiconductor layer 26 of the insulating layer 34, which is e.g. of ZnS. This layer 34, which is more particularly deposited by CVD has a thickness of 0.5 µm.

Figure 17:
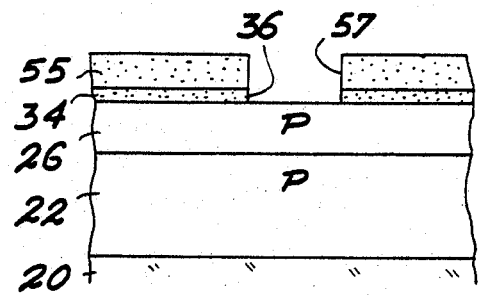

As shown in FIG. 17, using conventional photolithography processes, a resin mask 55 with a thickness of 2 μm is then produced, which has an opening 57 e.g. with a diameter of 5 μm. The diameter of opening 57 makes it possible to define the dimensions of the electric contact hole to be produced. Through said resin mask 55 is then formed an opening 36 in insulating layer 34 by eliminating the region of said insulating layer not covered by the resin. This elimination is carried out by chemical etching or ionic working.

The following stage of the process consists of ionic working of the semiconductor layer 26 and the semiconductor layer 22 using the resin mask 55 as a mask for said operation. Working takes place over the entire thickness of layer 26 and on part of layer 22, over a thickness of 0.5 to 5 μm. It also makes it possible to partly eliminate the resin mask 55. The thus formed electric contact hole 41 shown in FIG. 18 has a diameter of 5 μm and a depth of approximately 5 μm. The etching rate by ionic working of the semiconductor layers 22, 26 is 150 nm/min and the etching of the resin which remains takes place at 30 nm/min.

Figure 19:
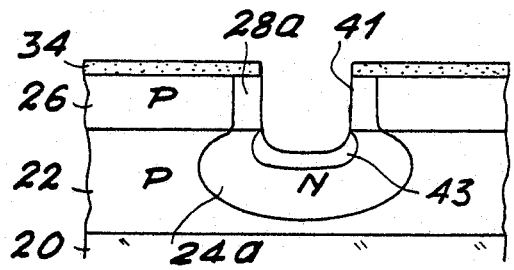

Following chemical cleaning of the resin residues, diffusion or implantation of ions takes place in contact hole 41, through the etched insulating layer 34, in order to form the sensitive zone of the photovoltaic detector. As shown in FIG. 19, said sensitive zone is formed from two type N regions 28a, 24a, whose composition x is respectively that of the semiconductor layers 26 and 22 in which they are defined.

The formation of the N regions 28a and 24a, by ion implantation or diffusion in the electric contact hole 41 makes it possible, compared with the process described with reference to FIGS. 8 to 15, to reduce the perimeter of the N region 28a formed in the semiconductor layer with the strongest composition $x_2$. In order to permit conductivity reversal, it is possible to use mercury ions in the case of diffusion and boron ions in the case of ionic implantation.

The diffusion or implantatiion of these ions and consequently the form of the N regions obtained is dependent on the composition x of the semiconductor layer in which they are diffused or implanted. More particularly in the case of the diffusion of mercury ions, the article by N. BROWN and A. F. W. WILLOUGHBY, published in the Journal of Crystal Growth 59, 1982, pp.27-39 and entitled "Diffusion in $Cd_xHg_{1-x}Te$ and related materials", shows that mercury diffuses roughly ten times faster in a semiconductor material of composition $x=0.2$ than in a material of composition $x=0.4$ under the same operating conditions.

Moreover, the Applicant has found that when the composition x of the semiconductor material varies from 0.2 to 0.3, the depth of the diffused N region obtained under the same mercury diffusion conditions varies by more than a factor of 2.

If, in accordance with the invention, there is a type N lateral diffusion over roughly 10 micrometers into the semiconductor material of composition $x_1=0.2$, the corresponding diffusion into the semiconductor material of composition $x_2=0.4$ will be roughly 1 μm. The N region formed in the semiconductor material of composition $x_1$ could also be called "buried" region, bearing in mind the considerable surface difference developed with the N region of the semiconductor material of composition $x_2$.

Figure 20:
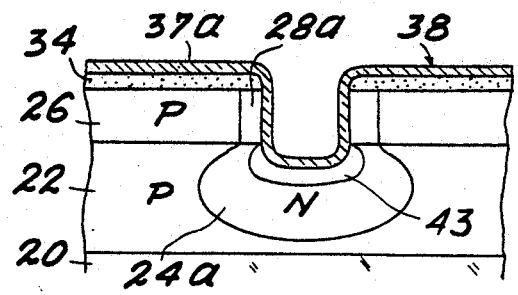

Following the formation of type N regions 24a and 28a, there is optionally an implantation of boron ions in order to overdope the bottom 43 of the contact hole 41. Finally and as shown in FIG. 20, there is a metallization of the surface of the structure, e.g. formed from two layers, namely a gold layer and a chromium layer, which is then etched to form the electric contact element 38a of the photovoltaic detector. In the present case part 37a of contact element 38a located on insulating layer 34 can completely cover the active zone of the detector, because the detector is to be illuminated by its rear face, i.e. from the side of substrate 20.

Figure 18:
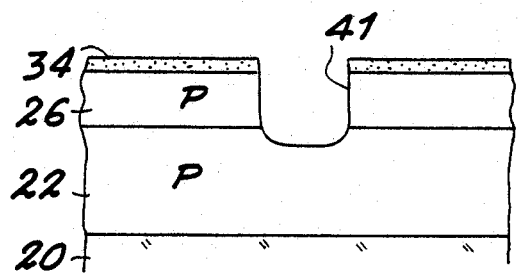

In the case of the photovoltaic detector with illumination from the front, the formation of N regions after producing the contact hole, as described relative to FIGS. 17 to 19 in connection with the production of a detector with illumination from the rear, is not desirable, because the shape and dimensions of these N regions might not be well controlled.

The structure shown in FIG. 20 is much more compact and simple than that obtained previously (FIG. 15). It is perfectly adapted to the production of a mosaic of in particular infrared photovoltaic detectors of a very dense nature and with a large number of points.

What is claimed is:

1. A photovoltaic detector with a planar structure having a first $Hg_{1-x_1}Cd_{x_1}Te$ monocrystalline semiconductor layer with a first conductivity type, $x_1$ being a number between 0 and 1, said first semiconductor layer containing a first region of a second conductivity type, an electrical insulant located above the first semiconductor layer and an electric contact element located on the insulant serving to collect the electric signal produced in said first region, wherein a second $Hg_{1-x_2}Cd_{x_2}Te$ monocrystalline semiconductor layer of the first conductivity type is interposed between the first semiconductor layer and the insulant, $x_2$ being a number exceeding $x_1$, between 0 and 1, said second semiconductor layer containing a second region of the second conductivity type facing and in contact with said first region and wherein the contact element comprises a part traversing said second region and partly penetrating said first region.

2. A photovoltaic detector according to claim 1, wherein the first semiconductor layer rests on a monocrystalline substrate.

3. A photovoltaic detector according to claim 1, wherein the first and second semiconductor layers have a type P conductivity and the first and second regions a type N conductivity.

4. A photovoltaic detector according to claim 1, wherein the first region has a thickness between 0.5 and 5 μm.

5. A photovoltaic detector according to claim 1, wherein $x_1$ is equal to 0.2 and $x_2$ equal to 0.4.

6. A photovoltaic detector according to claim 1, wherein the contact element only partly covers the first and second regions.

7. A photovoltaic detector according to claim 1, wherein means for processing a signal produced in the first region is provided in the second semiconductor layer.

8. A photovoltaic detector according to claim 1, wherein said electrical insulant is formed with a first and a second insulating layer.

9. A photovoltaic detector according to claim 1, wherein an overdoping of the second conductivity type is provided in contact with said part of said electric contact element penetrating said first region.

10. A photovoltaic detector according to claim 7, wherein said means comprise a NMOS transistor coupled to a charge transfer device.

11. A photovoltaic detector with a planar structure having a first $Hg_{1-x_1}Cd_{x_1}Te$ monocrystalline semiconductor layer with a first conductivity type, $x_1$ being a number between 0 and 1, said first semiconductor layer containing a first region of a second conductivity type, an electrical insulant located above the first semiconductor layer and an electric contact element located on the insulant serving to collect the electric signal produced in said first region, wherein a second $Hg_{1-x_2}Cd_{x_2}Te$ monocrystalline semiconductor layer of the first conductivity type is interposed between the first semiconductor layer and the insulant, $x_2$ being a number exceeding $x_1$, between 0 and 1, said second semiconductor layer containing a second region of the second conductivity type facing and in contact with said first region and wherein the contact element comprises a part traversing said second region and partly penetrating said first region, and a means for processing a signal produced in the first region being provided in the second semiconductor layer, said means comprise a NMOS transistor coupled to a charge transfer device.

* * * * *

UNITED STATES PATENT AND TRADEMARK OFFICE
CERTIFICATE OF CORRECTION

PATENT NO. : 4,791,467
DATED : December 13, 1988
INVENTOR(S) : Daniel Amingual and Pierre Felix It is certified that error appears in the above-identified patent and that said Letters Patent is hereby corrected as shown below:

In the Abstract, line 2, delete [$Cd_{xi}$] and insert --$Cd_{xL}$--.

Column 1, line 20, delete [$\mu_c$] and insert --$\lambda_c$--.

Column 1, line 43, delete [raading] and insert --reading--.

Column 2, lines 12 & 13, delete [temperature] and insert --temperatures--.

Column 5, line 25, delete [heterostruture] and insert --heterostructure--.

Column 6, lines 41 & 42, delete [extending].

Column 12, line 19, delete [in particular] and insert --, in particular,--.

Signed and Sealed this

Ninth Day of May, 1989

Attest:

DONALD J. QUIGG

Attesting Officer

Commissioner of Patents and Trademarks